United States Patent [19]
Cha et al.

[11] Patent Number: 6,018,485
[45] Date of Patent: Jan. 25, 2000

[54] SEMICONDUCTOR MEMORY DEVICE WITH CASCADED BURN-IN TEST CAPABILITY

[75] Inventors: Gi-Won Cha; Jae-Youn Youn, both of Kyunggi-do, Rep. of Korea

[73] Assignee: Samsung Electronics Co., Ltd., Suwon, Rep. of Korea

[21] Appl. No.: 09/221,828

[22] Filed: Dec. 28, 1998

[30]     Foreign Application Priority Data

Dec. 29, 1997 [KR] Rep. of Korea ....................... 97-77273

[51] Int. Cl.⁷ ....................................................... G11C 7/00
[52] U.S. Cl. ........................................... 365/201; 365/194
[58] Field of Search ............................... 365/201, 230.03, 365/194; 371/22.5

[56]       References Cited

U.S. PATENT DOCUMENTS

| | | | |
|---|---|---|---|
| 5,638,331 | 6/1997 | Cha et al. | 365/201 |
| 5,657,282 | 8/1997 | Lee | 365/201 |
| 5,680,362 | 10/1997 | Parris et al. | 365/201 |
| 5,732,032 | 3/1998 | Park et al. | 365/201 |

*Primary Examiner*—Son T. Dinh
*Attorney, Agent, or Firm*—Jones Volentine, LLP

[57]       ABSTRACT

A semiconductor memory device with a cascaded burn-in test capability for a plurality of memory cell blocks. A delayed feedback signal is communicated between memory cell block selection circuits to create the cascade burn-in.

8 Claims, 5 Drawing Sheets

SEMICONDUCTOR MEMORY DEVICE WITH CASCADED BURN-IN TEST CAPABILITY

BACKGROUND OF THE INVENTION

The present invention relates to a semiconductor memory device. More particularly, the present invention relates to a semiconductor memory device with circuits for distributing the power dip generated during a burn-in test.

Typically, a burn-in test is performed on all electronic components to stabilize performance characteristics, and identify defects or stress failures. This is certainly true of semiconductor devices. However, the simultaneous fabrication of many semiconductor devices on a single silicon wafer creates additional challenges to the performance of burn-in testing. In fact, the burn-in test of semiconductor devices is usually performed as part of the packaging step. A such it is impossible to repair any defects found during testing. This result is increased manufacturing cost and time.

In a semiconductor memory device such as dynamic random access memory (DRAM), most of the defects found relate to single bit defects which require a lengthy test time to identify. The single bit defect may be caused, for example, by defects in the gate oxide layer of a transfer gate, or the junction between the dielectric layer of a storage capacitor and the storage node. Any one of these exemplary problems will cause current leakage such that the memory cell must be deemed defective.

Conventionally, when performing an initial burn-in test on a 64 Mbit DRAM, a single word line is selected for every 4096 or 8192 cycles. Thus, the efficiency in applying a stress voltage to the all memory cells is low. In order to improve such efficiency as well as to reduce the burn-in test time, a method has previously been proposed wherein all word lines are simultaneously selected while the semiconductor devices are yet in the wafer state. This may improve the yield rate, reducing the overall production cost. However, if all the word lines (for example, the main and section word lines of DRAM) are simultaneously activated, a high charge consumption is required, so that it takes a long time to set the section word lines to the required voltage level.

In order to resolve this problem, all the main word lines are first selected, and then the section word lines are properly divided to be sequentially activated according to an address coding. However, this process also suffers from a drawback in which the power line is subjected to a large load because simultaneous activation of the main word lines requires a large amount of power. This is increasingly true as integration of DRAM increases.

Finally the conventional solution may result in damage to the power line. Although this result may be avoided by increasing the area of the power line, such remedy increases chip size. Moreover, it is not economical to increase the area of the power line simply to perform a burn-in test.

SUMMARY OF THE INVENTION

It is an object of the present invention to provide a semiconductor memory device with means for preventing a large load from being instantly applied to the power line during the burn-in test of a semiconductor wafer.

Thus, in one aspect, the present invention provides a semiconductor memory device including an address buffer, and first and second memory cell blocks in a memory cell array, comprising; a first block selection circuit selecting the first memory cell block during a burn-in test, and generating a burn-in signal, a delay circuit generating a delayed feedback signal in response to the burn-in signal, and a second block selection circuit selecting the second memory cell block in response to the delayed feedback signal.

The first block selection circuit may comprise a first block decoder receiving an address signal from the address buffer and a burn-in test initiation signal, and generating a first memory cell block selection signal in response to the address signal and the burn-in test initiation signal, a first main word line decoder, and a first section word line decoder. In operation the first block decoder, the first main word decoder, and the first section word decoder cooperate to select the first memory cell block during the burn-in test.

The semiconductor memory device may use the output of the first block decoder to form the burn-in signal, or the output of the first main word line decoder to form the burn-in signal.

The second block selection circuit comprises; a second block decoder receiving the delayed feedback signal from the delay circuit and generating a second memory cell block selection signal in response to the delayed feedback signal, a second main word line decoder, and a second section word line decoder. In operation the second block decoder, the second main word decoder, and the second section word decoder cooperate to select the second memory cell block during the burn-in test.

In another aspect, the present invention provides a method of performing a burn-in test during the wafer stage of a semiconductor memory device fabrication process, the semiconductor memory device comprising an address buffer, and first and second memory cell blocks of a memory cell array, and the method comprising the steps of; selecting the first memory cell block in response to an address signal from the address buffer and a burn-in initiation signal, forming a delayed feedback signal in response to the step of selecting the first memory cell block, and selecting the second memory cell block in response to the delayed feedback signal, the address signal, and the burn-in initiation signal.

In yet another aspect, the present invention provides; a method of performing a burn-in test during the wafer stage of a semiconductor memory device fabrication process, the semiconductor memory device comprising a plurality of memory cell blocks, each memory cell block in the plurality of cell blocks having associated with it a selection circuit, the method comprising the steps of; selecting one memory cell block using its associated selection circuit, forming a delayed feedback signal in response to the selection of the one memory cell block, and selecting another memory cell block in sequence responsive to the delayed feedback signal.

BRIEF DESCRIPTION OF THE ATTACHED DRAWINGS

The present invention may be better understood with its attendant advantages by reference to the following detailed description of the preferred embodiment(s) and the accompanying drawings in which.

DETAILED DESCRIPTION OF THE PREFERRED EMBODIMENTS

Figure 1:
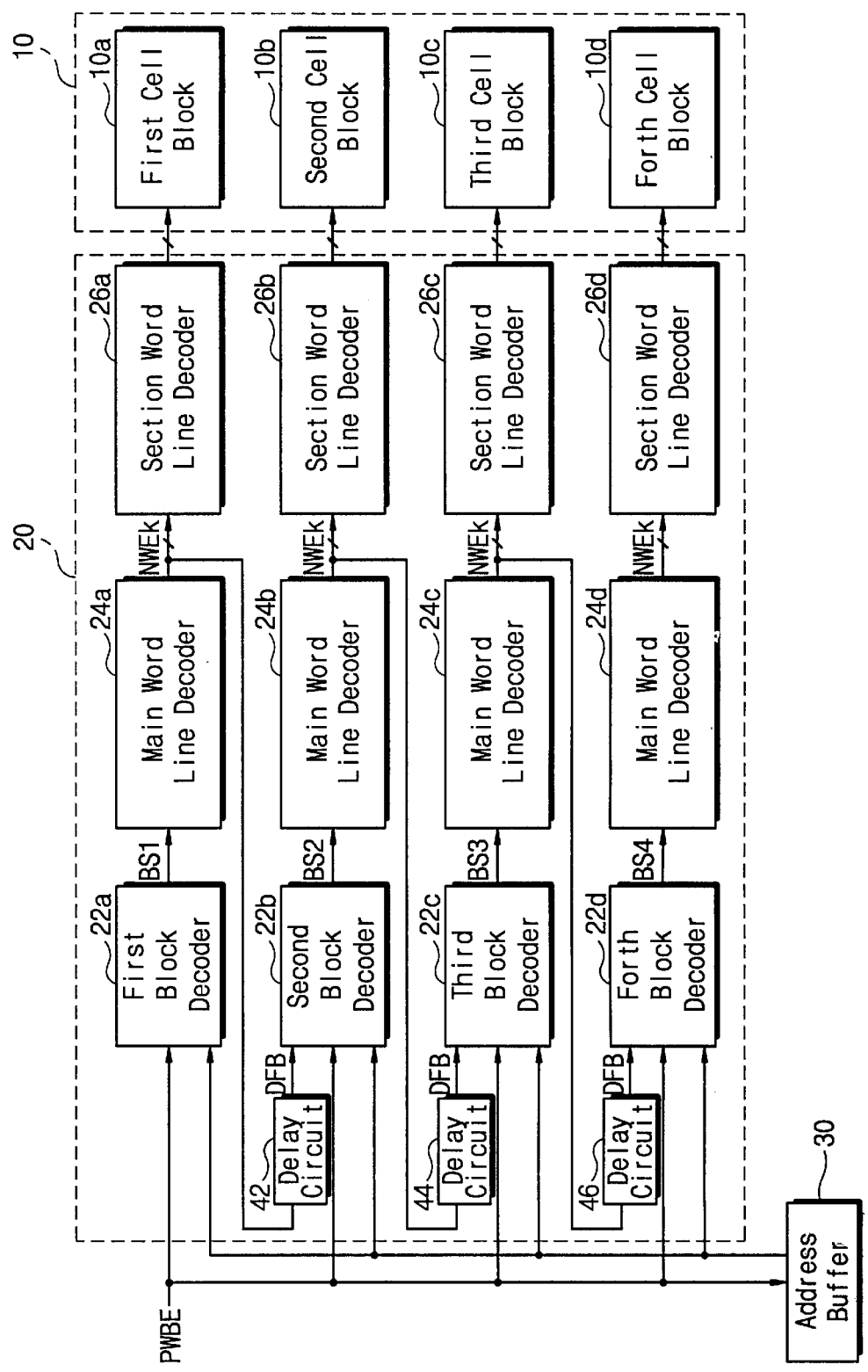
FIG. 1 is a block diagram illustrating the structure of a semiconductor memory device according to one embodiment of the present invention.
Figure 3:
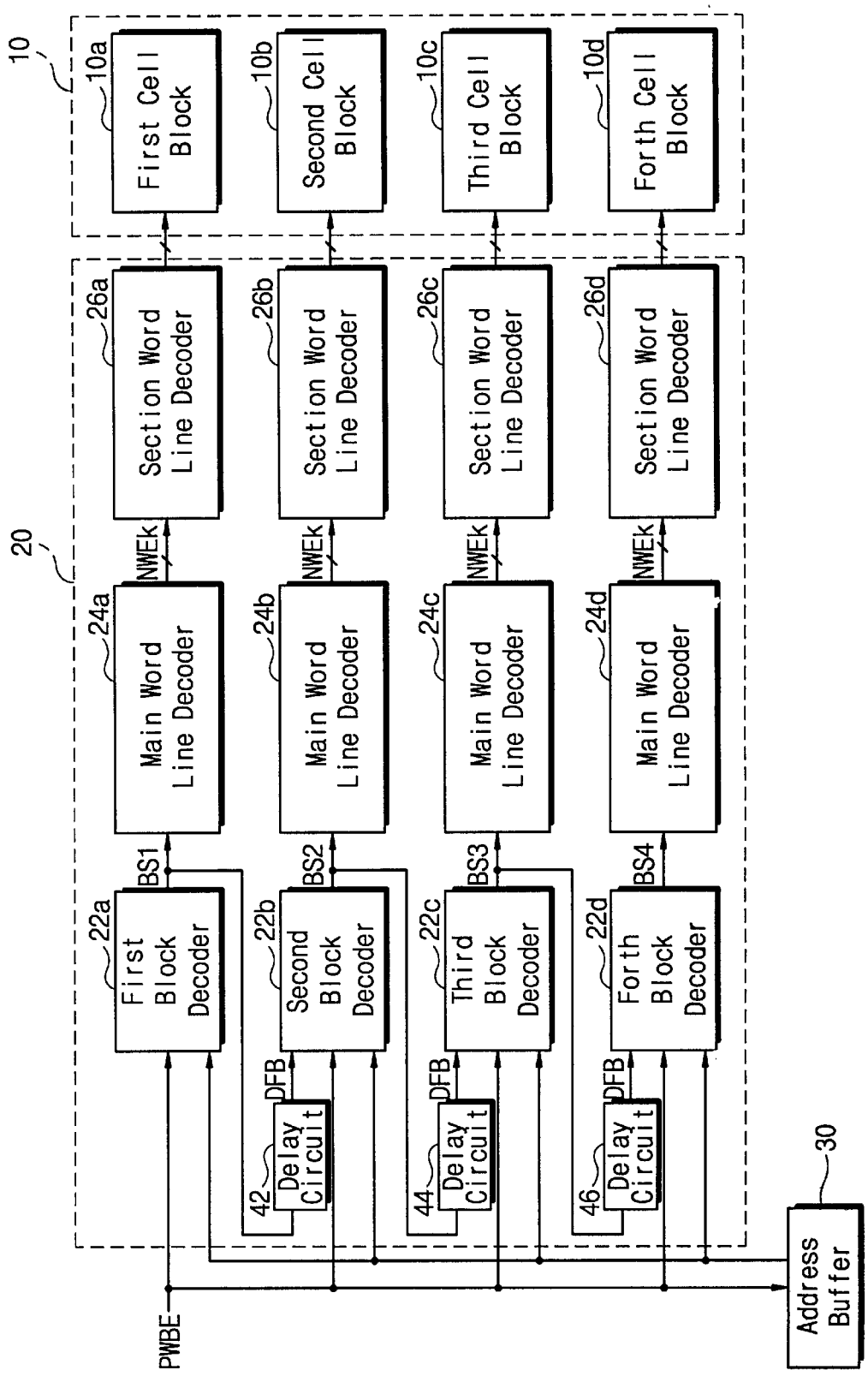
FIG. 3 is a block diagram illustrating the structure of a semiconductor memory device according to another embodiment of the present invention.
Figure 4:
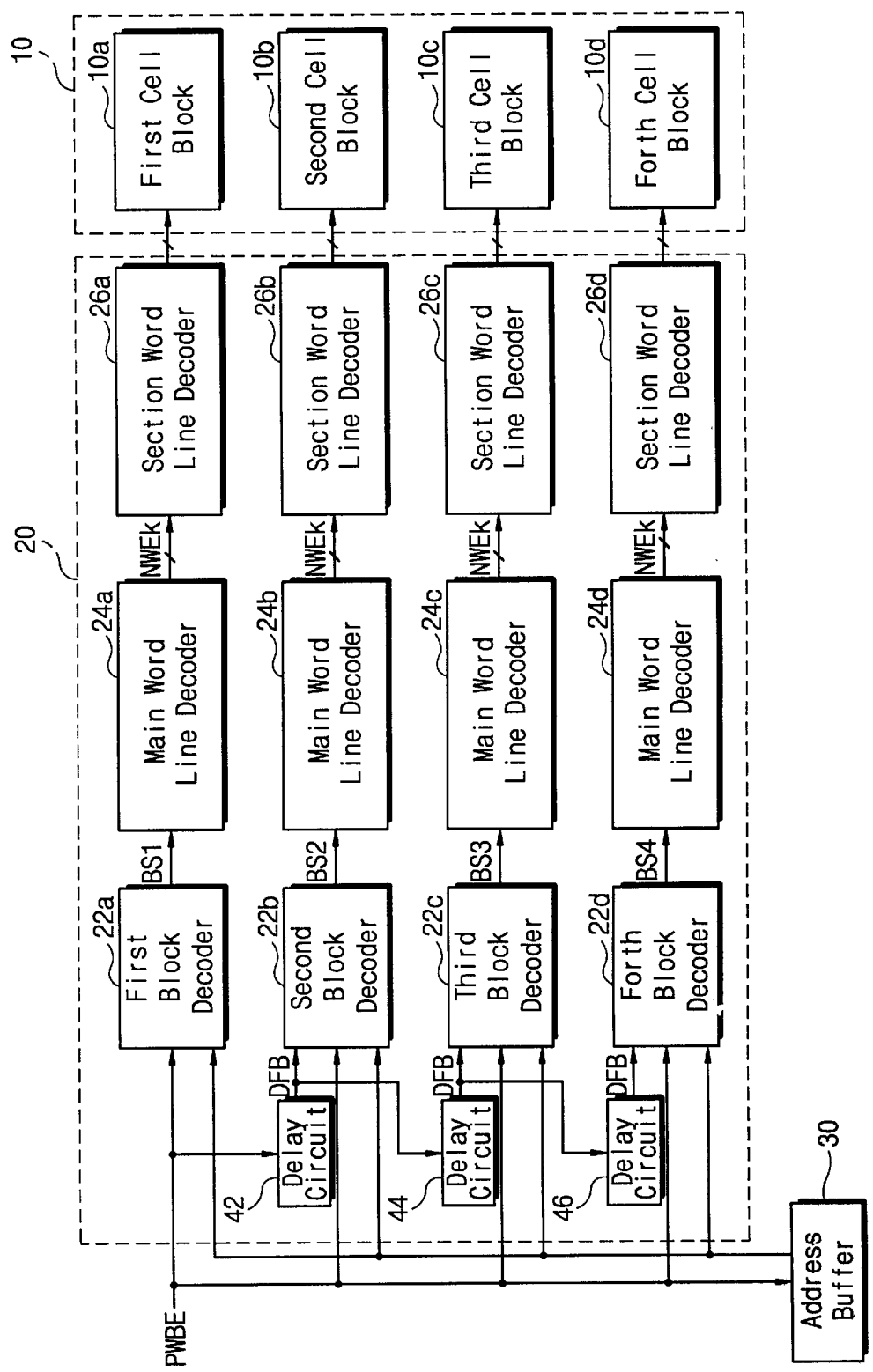
FIG. 4 is a block diagram illustrating the structure of a semiconductor memory device according to a yet another embodiment of the present invention.

Referring to FIGS. 1, 3 and 4, a semiconductor memory device includes a memory cell array 10 divided into a plurality of cell blocks 10a, 10b, 10c and 10d, and a block selection circuit 20 for sequentially selecting cell blocks 10a, 10b, 10c and 10d during the burn-in test. This arrangement distributes the instantaneous power consumption upon burn-in test initiation, thereby reducing the load applied to the power line.

An address buffer 30 is also provided. The block selection circuit 20 includes a plurality of block decoders 22a, 22b, 22c, 22d, a plurality of main word line decoders 24a, 24b, 24c, 24d and a plurality of section word line decoders 26a, 26b, 26c, 26d, corresponding to the cell blocks 10a, 10b, 10c, 10d. There is also provided delay circuits 42, 44 and 46 corresponding to the second, third and fourth cell blocks 10b, 10c and 10d, as shown in FIG. 1. Throughout the drawings these reference numerals are used to describe similar functional parts.

Figure 2A:
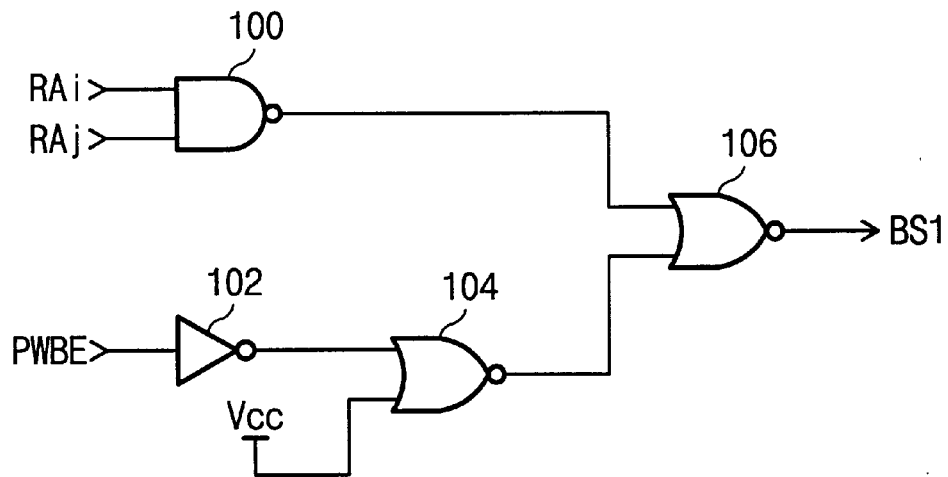
FIGS. 2A and 2B are circuit diagrams illustrating the block decoder shown in FIG. 1 in greater detail.

Block decoder 22a corresponding to first cell block 10a comprises a NAND gate 100, an inverter 102, and two NOR gates 104 and 106, as shown in FIG. 2A. The signal PWBE, or "the burn-in initiation signal," goes high to indicate the start of a burn-in test, but otherwise remains low during normal operation. In normal operation, both inputs Rai and Raj, or "address signal" from the address buffer, of NAND gate 100 are high thus producing a low output. Since one input of NOR gate 104 is connected to a source voltage Vcc, its output is always low regardless of the state of signal PWBE. With both inputs to NOR gate 106 low, it generates a high output BS1 to select the first cell block 10a.

Figure 2B:
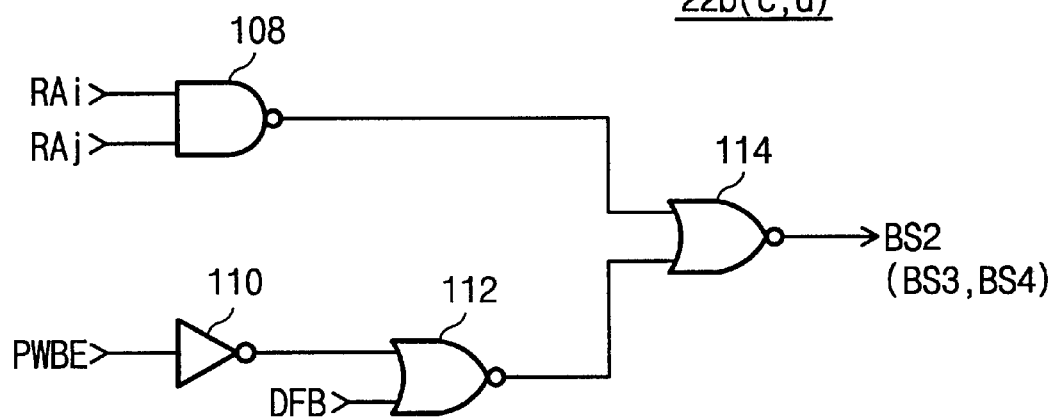

Referring to FIG. 2B, the second, third and fourth block decoders 22b, 22c, 22d corresponding to the second, third and fourth cell blocks 10b, 10c, and 10d have the same structure as that shown in FIG. 2A, except one input to NOR gate 112 is connected to a signal DFB instead of source voltage Vcc. The signal DFB is a delayed feedback signal obtained by delaying one of the first selection signals NWEk from the previous main word line decoder 24a through delay circuit 42, as shown in FIG. 1. Namely, second block decoder 22b is activated by signal DFB. Likewise, third block decoder 22c is activated by the delayed feed back signal DFB obtained by delaying one of the selection signals NWEk generated from second main word line decoder 24b through delay circuit 44. Likewise activated is the fourth block decoder 22d. The delay circuits 42, 44, and 46 are designed to have the delay time sufficient to compensate for the power dip generated by the simultaneous activation of the main word lines corresponding to the previous cell block, as shown in FIG. 1.

Describing the burn-in test operation in reference to FIGS. 1, 2A and 2B, the test begins when burn-in initiation signal PWBE goes from low to high, so that the outputs of address buffer 30, the address signal, are all set at high thus making the respective outputs of NAND gates 100 or 108 of decoders 22a, 22b, 22c, and 22d go low. In this case, the block selection signal BS1 of first block decoder 22a corresponding to first cell block 10a is set to high while the block selection signals BS2, BS3, BS4 of the other block decoders 22b, 22c, and 22d remain low, due to delay applied to delayer feedback signal DFB subsequently applied to NOR gate 112 as shown in FIG. 2B.

The activated block selection signal BS1 of first block decoder 22a corresponding to first cell block 10a is supplied to the first main word line decoder 24a to simultaneously select all the main word lines. Then, the selection signals NWEk are set to high so that section word line decoder 26a selects the section word lines of first cell block 10a according to the address coding. It will be readily understood by those skilled in the art that the main word line decoders 24a, 24b, 24c, and 24d, as well as section word line decoders 26a, 26b, 26c, and 26d are provided with corresponding address signals to perform the coding operation, though not shown in the drawings for the sake of clarity.

Thereafter, delay circuit 42 corresponding to second cell block 10b delays one of the signals NWEk activating the main word lines of first cell block 10a by a desired time period to produce the delayed feedback signal DFB, which is then applied to the corresponding block decoder 22b to generate the block selection signal BS2 to activate the corresponding main word line decoder 24b. Then, there are simultaneously activated the signals NWEk to select the main word lines of second cell block 10b. Subsequently, the corresponding section word line decoder 26b selects the section word lines according to the address coding. Likewise, the main word lines of the third and fourth cell blocks 10c and 10d are sequentially selected.

Alternatively, the feedback signals supplied to the delay circuits 42, 44 and 46 may be output from block decoders 22a, 22b, and 22c corresponding to the previous selected cell blocks 10a, 10b, and 10c, as shown in the second embodiment of FIG. 3. The delay time should be designed to sufficiently compensate for the power dip generated by the simultaneous activation of the main word lines corresponding to the previous cell block.

Alternatively, the feedback signals supplied to delay circuits 42, 44 and 46 may be the burn-in test signal PWBE. Namely, after passing the delay time to compensate for the power dip generated by the simultaneous activation of the main word lines corresponding to the previous cell block, delay circuit 42 transfers the signal DFB to the corresponding block decoder 22b, and thereafter the delay circuits 44 and 46 to the third and fourth block decoders 22c and 22d, respectively. In this way, the main word lines corresponding to the cell blocks are sequentially selected.

Figure 5:
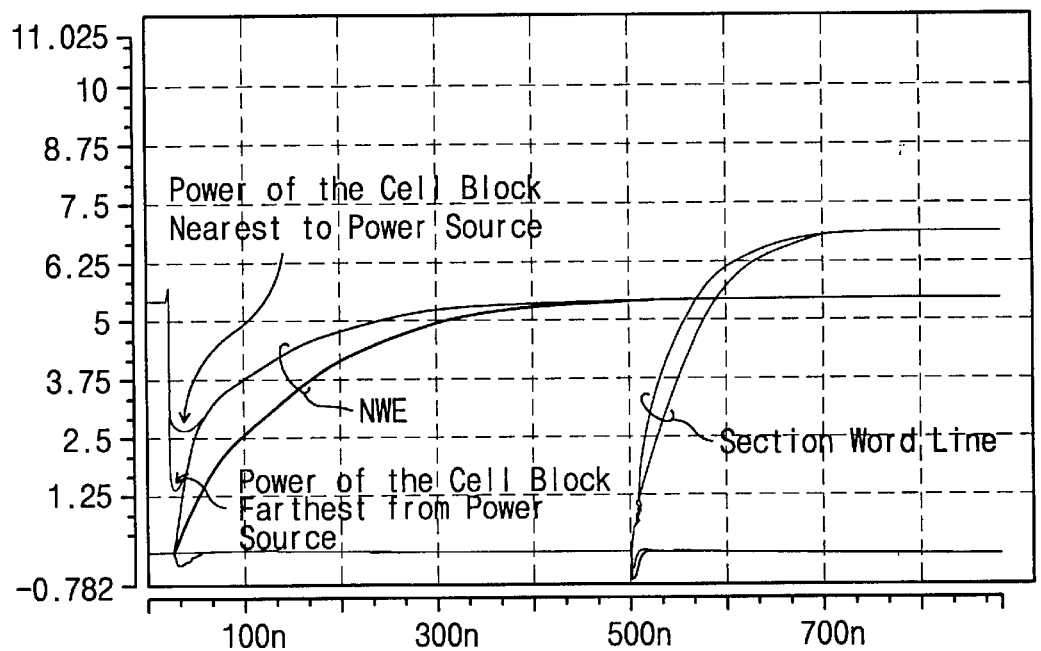
FIG. 5 is a graph illustrating the characteristics of the power dip generated by simultaneous selection of the main word lines corresponding to all the cell blocks as required by the conventional method.
Figure 6:
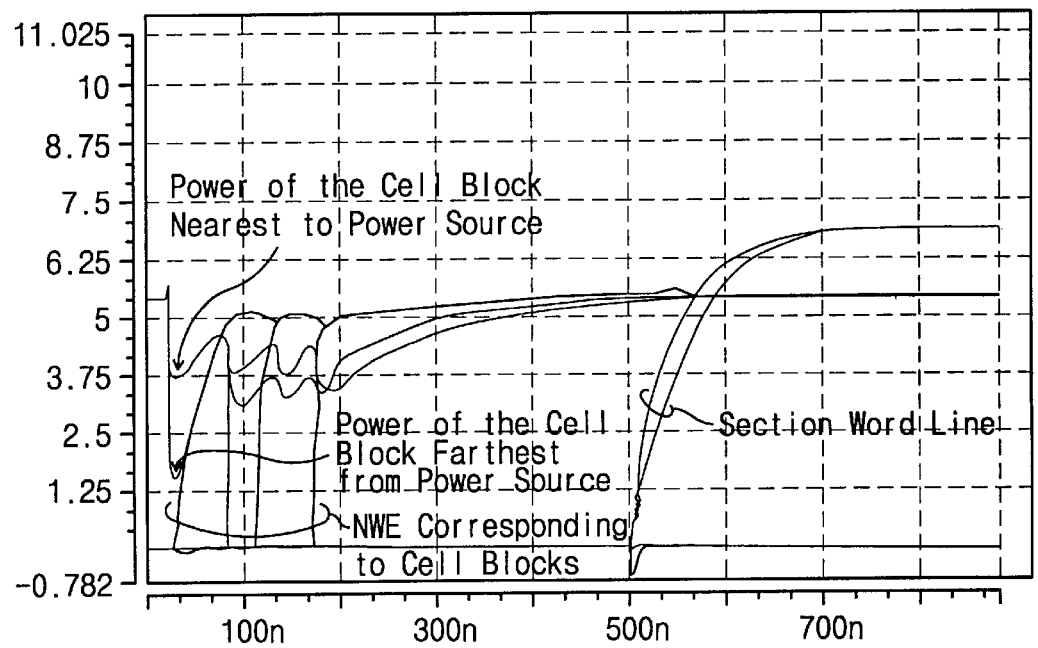
FIG. 6 is a graph similar to FIG. 5 illustrating the characteristics of the power dip according to the embodiments of the present invention.

Thus, the inclusion of delay circuits effects a sequential selection of main word line decoders so as to distribute the power consumption required to simultaneously activate the main word lines of the cell blocks, as shown by a comparison between the results illustrated in FIG. 6 and the conventional method result shown in FIG. 5.

The present invention has been described specifically in connection with the preferred embodiments. One of ordinary skilled in the art will appreciate that various changes and modifications may be made without departing from the scope of the present invention, as defined by attached claims. For example, the preferred embodiments are drawn to a four memory cell block arrangement of the memory cell array, but any plurality of memory cell blocks may be used.

What is claimed is:

1. A semiconductor memory device including an address buffer, and first and second memory cell blocks in a memory cell array, comprising:

a first block selection circuit selecting the first memory cell block during a burn-in test, and generating a burn-in signal;

a delay circuit generating a delayed feedback signal in response to the burn-in signal; and, a second block selection circuit selecting the second memory cell block in response to the delayed feedback signal.

2. The semiconductor memory device of claim 1, wherein the first block selection circuit comprises:

a first block decoder receiving an address signal from the address buffer and a burn-in test initiation signal, and generating a first memory cell block selection signal in response to the address signal and the burn-in test initiation signal;

a first main word line decoder, and a first section word line decoder, wherein the first block decoder, the first main word line decoder, and the first section word line decoder cooperate to select the first memory cell block during the burn-in test.

3. The semiconductor memory device of claim 2, wherein an output of the first block decoder forms the burn-in signal.

4. The semiconductor memory device of claim 2, wherein an output of the first main word line decoder forms the burn-in signal.

5. The semiconductor memory device of claim 2, wherein the second block selection circuit comprises:

a second block decoder receiving the delayed feedback signal from the delay circuit and generating a second memory cell block selection signal in response to the delayed feedback signal;

a second main word line decoder, and a second section word line decoder, wherein the second block decoder, the second main word line decoder, and the second section word line decoder cooperate to select the second memory cell block during the burn-in test.

6. The semiconductor memory device of claim 5, wherein the second block decoder also receives the address signal from the address buffer and the burn-in initiation signal, and generates the second memory cell block selection signal in response to the delayed feedback signal, the address signal, and the burn-in imitation signal.

7. A method of performing a burn-in test during the wafer stage of a semiconductor memory device fabrication process, the semiconductor memory device comprising an address buffer, and first and second memory cell blocks of a memory cell array, and the method comprising the steps of:

selecting the first memory cell block in response to an address signal from the address buffer and a burn-in initiation signal;

forming a delayed feedback signal in response to the step of selecting the first memory cell block; and, selecting the second memory cell block in response to the delayed feedback signal, the address signal, and the burn-in initiation signal.

8. A method of performing a burn-in test during the wafer stage of a semiconductor memory device fabrication process, the semiconductor memory device comprising a plurality of memory cell blocks, each memory cell block in the plurality of cell blocks having associated with it a selection circuit, the method comprising the steps of:

selecting one memory cell block using its associated selection circuit;

forming a delayed feedback signal in response to the selection of the one memory cell block; and, selecting another memory cell block in sequence responsive to the delayed feedback signal.

* * * * *